United States Patent [19]
Takemae

[11] Patent Number: 5,737,263
[45] Date of Patent: Apr. 7, 1998

[54] SEMICONDUCTOR MEMORY OF HIGH INTEGRATION, LARGE CAPACITY, AND LOW POWER CONSUMPTION

[75] Inventor: Yoshihiro Takemae, Kawasaki, Japan

[73] Assignee: Fujitsu Limited, Kanagawa, Japan

[21] Appl. No.: 688,740

[22] Filed: Jul. 31, 1996

[30] Foreign Application Priority Data

Mar. 19, 1996 [JP] Japan .................................. 8-063027

[51] Int. Cl.$^6$ .................................................. G11C 11/24
[52] U.S. Cl. ..................... 365/149; 365/189.09; 365/226
[58] Field of Search ........................... 365/149, 189.09, 365/226

[56] References Cited

U.S. PATENT DOCUMENTS 4,409,672 10/1983 Takemae .................................. 365/149
4,965,769 10/1990 Etoh et al. .......................... 365/149 X
5,337,270 8/1994 Kawata et al. ............................ 365/149

FOREIGN PATENT DOCUMENTS 6-215564 8/1994 Japan .

Primary Examiner—Joseph A. Popek
Attorney, Agent, or Firm—Nikaido, Marmelstein, Murray & Oram LLP

[57] ABSTRACT

A semiconductor memory has a plurality of bit lines, a plurality of word lines, a plurality of memory cells, a power source unit, and a plurality of sense amplifiers. The memory cells are formed at intersection portions of the bit lines and the word lines, and each of the memory cells includes a transistor and a capacitor. The power source unit is connected to the capacitors of the memory cells. Each of the sense amplifiers, which is connected to a corresponding one of the bit lines and the power source, is used to amplify a voltage between a potential of the corresponding bit line. This memory realizes high integration, large capacity, and low power consumption.

12 Claims, 10 Drawing Sheets

SEMICONDUCTOR MEMORY OF HIGH INTEGRATION, LARGE CAPACITY, AND LOW POWER CONSUMPTION

BACKGROUND OF THE INVENTION

1. Field of the Invention

The present invention relates to a semiconductor memory, and more particularly, to arrangements of sense amplifiers and bit lines of the semiconductor memory.

2. Description of the Related Art

Recently, semiconductor memories such as DRAMs (dynamic random access memories) use finer structures and larger storage capacities due to improvements in semiconductor manufacturing technology. It is required to provide a DRAM structure that realizes more integration and larger storage capacity.

In a conventional DRAM, sense amplifiers thereof are each constituted by a flip-flop used to read data from a memory cell, write data thereto, or read data from and rewrite the data to the memory cell. Further, in the conventional DRAM, each of the sense amplifiers is connected to complementary bit lines that run in parallel with each other to suppress external noise and are generally called a "holded bit line structure".

This conventional DRAM has memory cells at every second of the intersections of bit and word lines, and therefore, is disadvantageous in increasing the density of memory cells. When the density of memory cells is low, the size of each memory cell is relatively large, and therefore, two bit lines are sufficiently formed in the area of one memory cell. The alternate arrangement of memory cells, however, is an obstacle to densely arranging very small memory cells fabricated according to recent technology.

In another conventional DRAM, "open bit line structure" is employed instead of the above "holded bit line structure", and this conventional DRAM has memory cells at every intersection of bit and word lines, to realize a high-density large-capacity DRAM with very small memory cells. This conventional DRAM, however, is vulnerable to noise because each sense amplifier is unable to cancel noise on the complementary bit lines connected thereto.

The problems of the prior art will be explained later in detail with reference to the accompanying drawings.

SUMMARY OF THE INVENTION

An object of the present invention is to provide a semiconductor memory of high integration, large capacity, and low power consumption.

According to the present invention, there is provided a semiconductor memory comprising a plurality of bit lines; a plurality of word lines; a plurality of memory cells formed at intersection portions of the bit lines and the word lines, each of the memory cells including a transistor and a capacitor; a power source unit connected to the capacitors of the memory cells; and a plurality of sense amplifiers each connected to a corresponding one of the bit lines and the power source, for amplifying a voltage between a potential of the corresponding bit line and that of the power source.

The sense amplifiers may be formed on both sides of the bit lines, to reduce an interval between adjacent ones of the bit lines. The sense amplifiers may be arranged alternately on both sides of the bit lines.

The semiconductor memory may further comprise an insulation layer formed above the bit lines, a potential of the insulation layer being the same as that of cell plates of the capacitors of the memory cells. Wiring for connecting the cell plates of the capacitors of the memory cells may be arranged in parallel with the word lines.

The power source unit may generate an intermediate voltage between a first source voltage and a second source voltage. An output voltage of the power source unit may be applied to the cell plates of the capacitors of the memory cells, to the sense amplifiers through first gate transistors, and to the bit lines through second gate transistors. The first gate transistors and the second gate transistors may be controlled by a reset signal.

The semiconductor memory may further comprise a bit line control circuit for detecting a level of the bit lines through an input line that is capacitively coupled with the bit lines, and charging the bit lines, to cancel the detected level of the bit lines.

The power source unit may be an active power source circuit for actively controlling an output voltage thereof to a reference voltage. The reference voltage may be an intermediate voltage between a first source voltage and a second source voltage. The semiconductor memory may be a dynamic random access memory.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the present invention, the problems of prior arts will be explained with reference to FIGS. 1 and 2.

Figure 1:
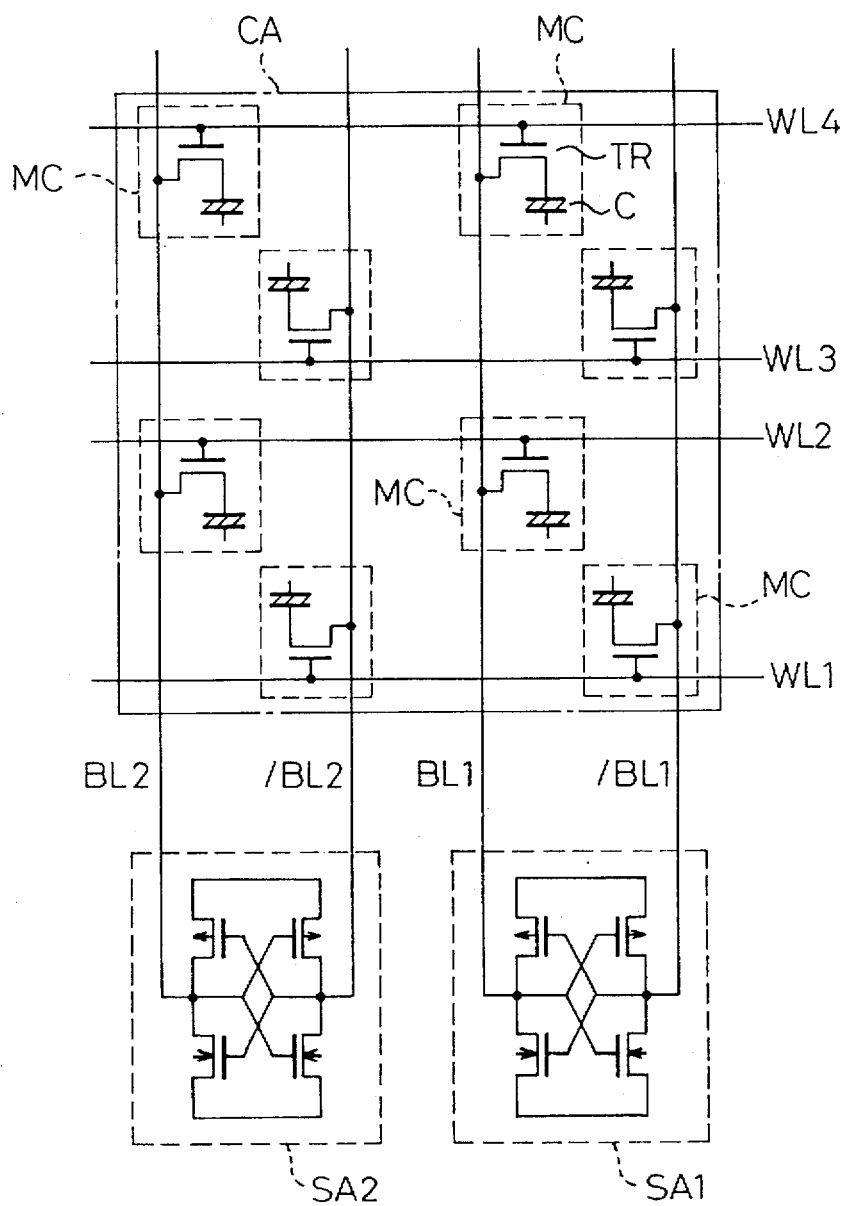
FIG. 1 is a circuit diagram showing a semiconductor memory according to a prior art.

FIG. 1 shows a DRAM according to a prior art. The DRAM has a memory cell array CA, word lines WL1 to WL4, bit lines BL1, /BL1, BL2, and /BL2, sense amplifiers SA1 and SA2, and memory cells MCs.

The memory cells are formed alternately at the intersections of the word and bit lines. Each of the memory cells consists of a transistor TR and a capacitor C.

Data in a memory cell that is connected to selected word and bit lines is read through a corresponding sense amplifier. The sense amplifier may write data to the memory cell, or read data from and rewrite the data to the same.

Each sense amplifier SA1 (SA2) is a flip-flop connected to the complementary bit lines BL1 and /BL1 (BL2 and /BL2).

Figure 2:
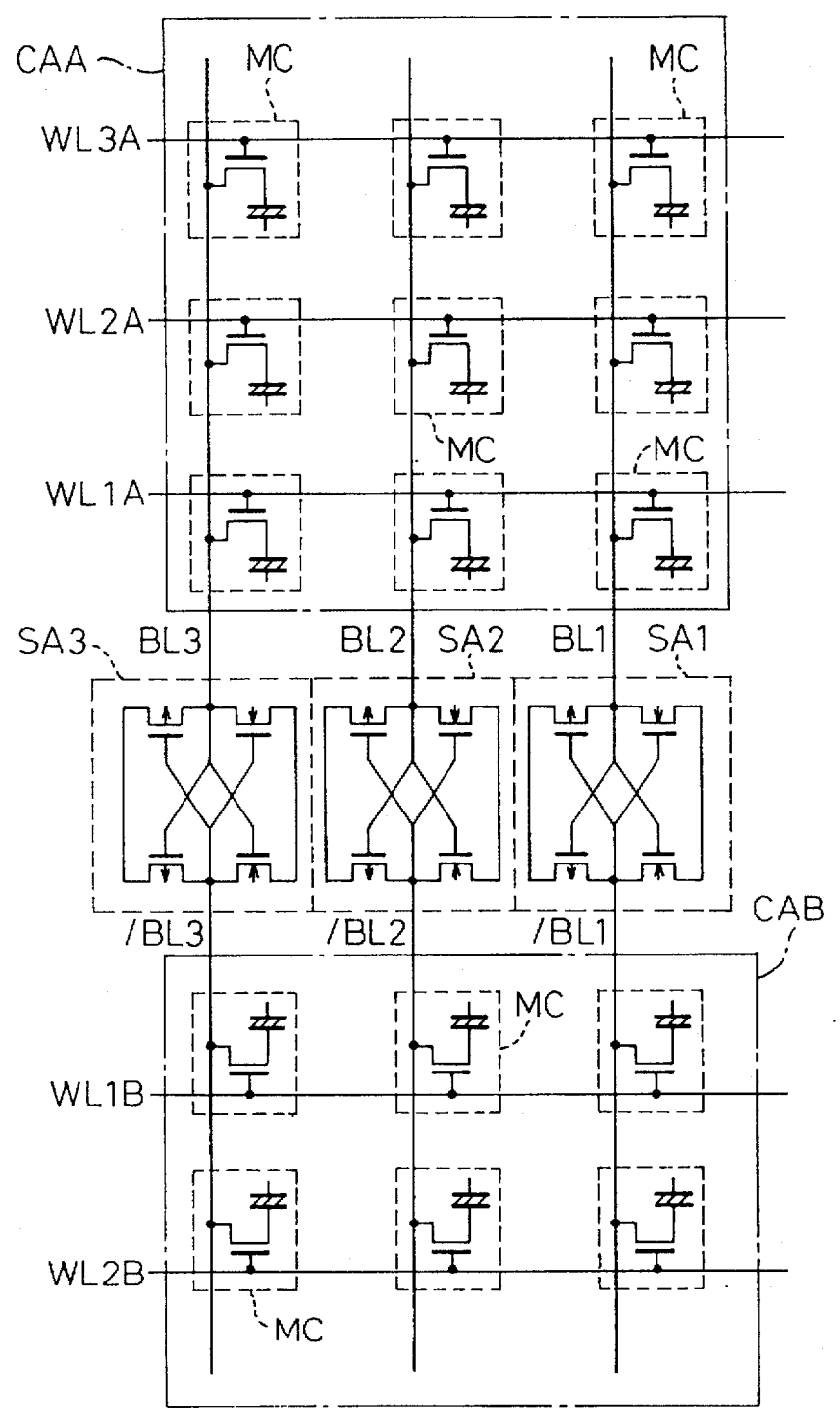
FIG. 2 is a circuit diagram showing a semiconductor memory according to another prior art.

FIG. 2 is a circuit diagram showing a DRAM according to another prior art.

This DRAM has memory cell arrays CAA and CAB on opposite sides of sense amplifiers SA1 to SA3. Positive logic bit lines BL1 to BL3 are formed on one side of the sense amplifiers SA1 to SA3, and negative logic bit lines BL1 to /BL3 are formed on the other side of the sense amplifiers. The bit lines BL1 to BL3 and /BL1 to /BL3 are complementary bit lines. Every one of the intersections of the bit and word lines is provided with a memory cell MC.

According to the prior art of FIG. 1, the complementary bit lines BL and /BL are in parallel with each other to cancel noise.

This prior art, however, arranges memory cells alternately at the intersections of the bit word lines, and therefore, is disadvantageous in densely arranging very small memory cells. When the density of memory cells is low, the size of each memory cell is relatively large, and therefore, two bit lines are sufficiently formed in the area of one memory cell. The alternate arrangement of memory cells, however, is an obstacle to densely arranging very small memory cells fabricated according to recent technology.

According to the prior art of FIG. 2, a memory cell is formed at every intersection of the bit and word lines, to realize a high-density large-capacity memory with very small memory cells. This prior art, however, is vulnerable to noise because each sense amplifier is unable to cancel noise on complementary bit lines BL and /BL connected thereto.

Next, preferred embodiments of the present invention will be explained.

Figure 3:
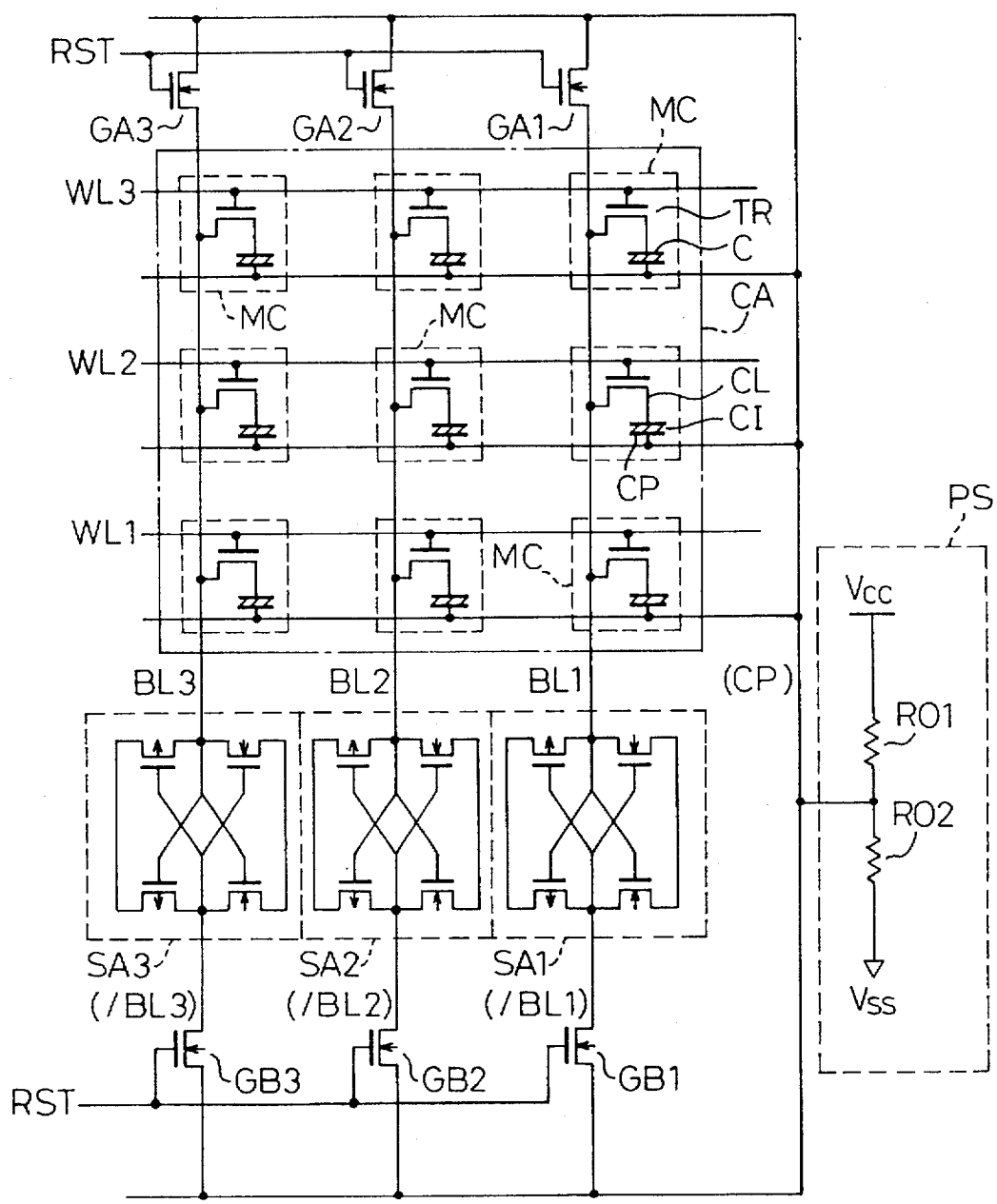
FIG. 3 is a circuit diagram showing a semiconductor memory according to an embodiment of the present invention.

FIG. 3 is a circuit diagram showing a DRAM according to an embodiment of the present invention. The DRAM has a memory cell array CA, a power source circuit PS, word lines WL1 to WL3, bit lines BL1 to BL3, sense amplifiers SA1 to SA3, and memory cells MCs.

The memory cells are formed at the intersections of the bit and word lines, respectively. Each of the memory cells consists of a transistor TR and a capacitor C. The gate of the transistor TR is connected to a corresponding word line, the source thereof is connected to a corresponding bit line, and the drain thereof is connected to an accumulation electrode of the capacitor C. Namely, the accumulation electrode of the capacitor C of each memory cell is connected to a corresponding bit line through the transistor TR. A cell plate CP of the capacitor C is connected to the power source circuit PS. The bit lines BL1 to BL3 are connected to terminals of the sense amplifiers SA1 to SA3, respectively.

Similar to the prior art of FIG. 2, the embodiment of FIG. 3 forms a memory cell at every intersection of the bit and word lines, and therefore, the embodiment is useful to densely arrange fine memory cells, to realize a high-integration large-capacity memory.

The power source circuit PS has, for example, resistors R01 and R02 having the same resistance arranged between a high voltage Vcc and a low voltage Vss. The resistors R01 and R02 divide the voltages and provide an intermediate voltage of, for example, Vcc/2. This voltage is passed through first gate transistors GB1 to GB3 and is applied to the other terminals (corresponding to /BL1 to /BL3) of the sense amplifiers SA1 to SA3. At the same time, the output voltage Vcc/2 of the power source circuit PS is passed through second gate transistors GA1 to GA3 and is applied to the bit lines BL1 to BL3. The gates of the first and second gate transistors GB1 to GB3 and GA1 to GA3 receive a reset signal RST, so that both the terminals of the sense amplifiers SA1 to SA3, i.e., the bit lines BL1 to BL3 and /BL1 to /BL3 are maintained at a reference voltage (Vcc/2) except during a memory access period, i.e., a sense amplifier active period.

Data stored in a memory cell connected to selected word and bit lines is read through a corresponding sense amplifier, or data is written to the selected memory cell through the sense amplifier, or data is read from and rewritten to the selected memory cell through the sense amplifier. Each of the sense amplifiers SA1 to SA3 is a flip-flop consisting of two n-channel MOS transistors and two p-channel MOS transistors.

Figure 4:
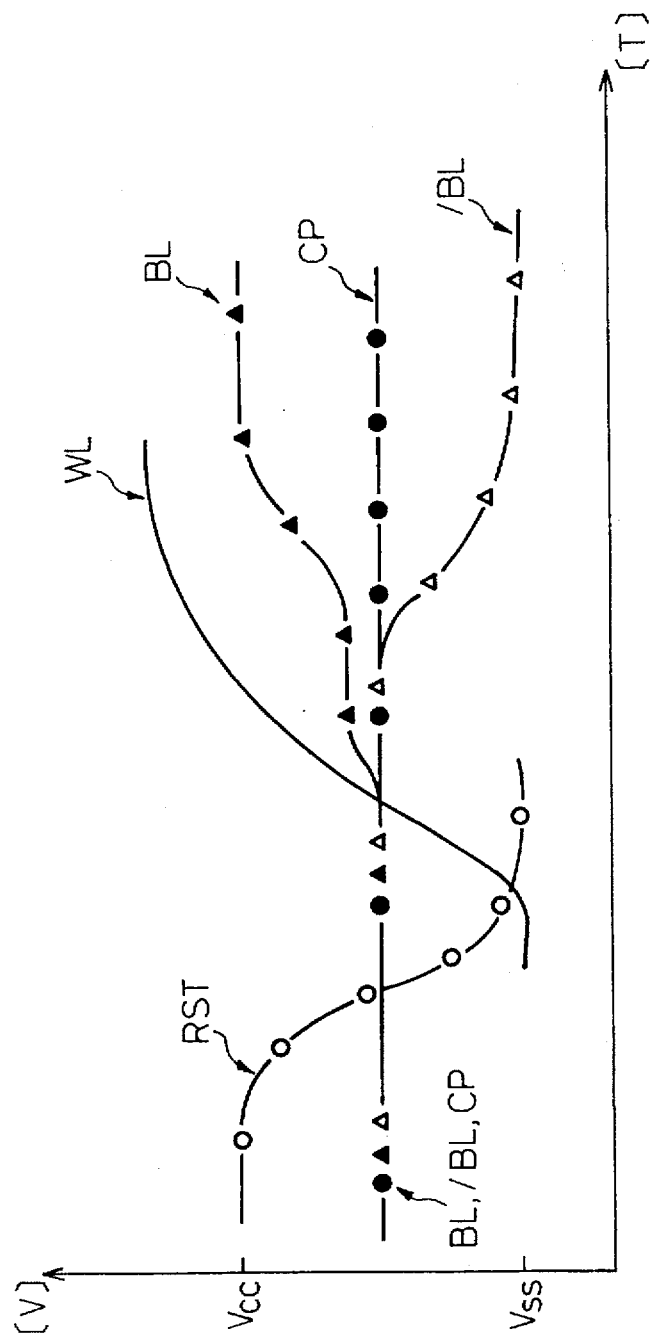
FIG. 4 is a waveform diagram showing the operation of the embodiment of FIG. 3.

FIG. 4 is a waveform diagram showing a read operation of the DRAM of FIG. 3.

The reset signal RST changes from HIGH to LOW to turn off the first and second gate transistors GB1 to GB3 and GA1 to GA3. As a result, the terminals of the sense amplifiers SA1 to SA3, i.e., the bit lines BL1 to BL3 and /BL1 to /BL3 change from the reference voltage of Vcc/2 to a floating state. A selected word line changes to HIGH, and a selected sense amplifier is activated (not shown) to select a corresponding memory cell. Data stored in the memory cell changes the potential of a corresponding bit line. In FIG. 4, the memory cell stores data "1," and therefore, the potential of the corresponding bit line slightly increases.

The corresponding sense amplifier amplifies the slight increase in the potential of the bit line. As a result, the potential of the BL side of the sense amplifier becomes HIGH (Vcc), and that of the /BL side thereof becomes LOW (Vss). At this time, the cell plate CP of the capacitor C of the memory cell in question is maintained at Vcc/2, which is the output of the power source circuit PS. The potential on the /BL side of the sense amplifier is irrelevant to reading the memory cell.

According to the prior art of FIG. 1, a change to HIGH in the bit line BL1 connected to the sense amplifier SA1 will cause a change to LOW in the other bit line /BL1 to which memory cells are connected. This means that reading data out of a memory cell connected to the bit line BL1 will cause power consumption by the other bit line /BL1.

On the other hand, the embodiment of FIG. 3 has substantially no floating capacitance on the /BL side of the selected sense amplifier, and therefore, the /BL side of the sense amplifier consumes substantially no power. As a result, power consumed by the embodiment for charging up/down a bit line is about half that of the prior art of FIG. 1.

Figure 5:
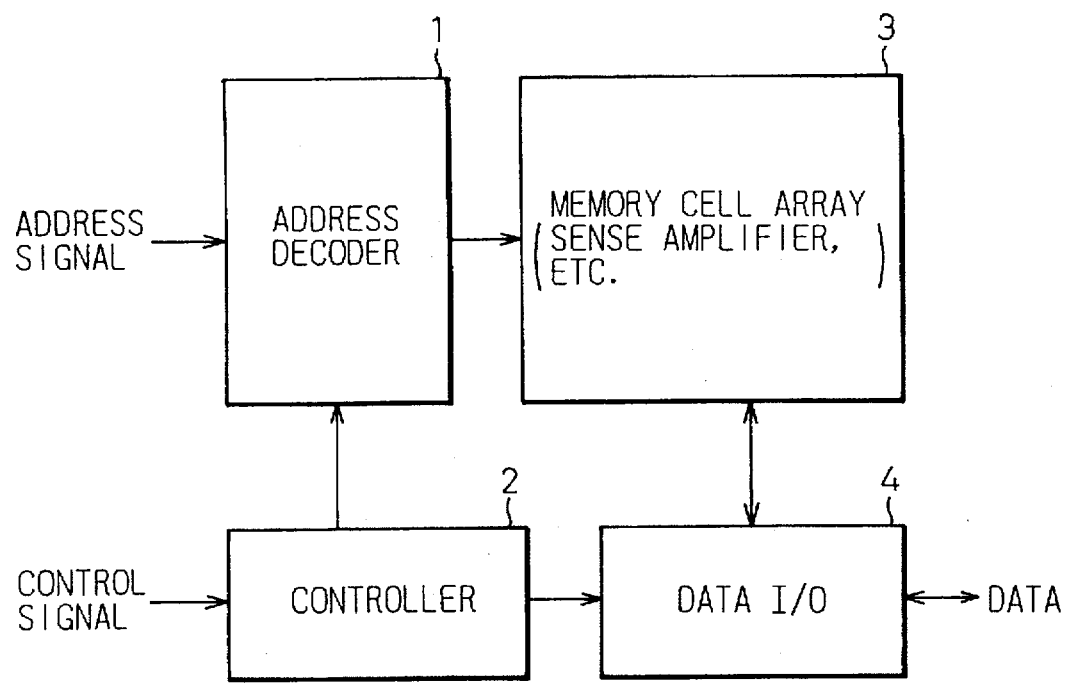
FIG. 5 is a block diagram generally showing a semiconductor memory according to the present invention.

FIG. 5 is a block diagram generally showing a DRAM according to the present invention. The DRAM has an address decoder 1, a controller 2, a memory cell array 3, and a data I/O circuit 4.

The address decoder 1 receives an external address signal to specify a memory cell to be accessed. The address decoder 1 includes a word decoder for selecting one of the word lines and a column decoder for selecting one of the bit lines (sense amplifiers). The controller 2 receives external control signals such as enable signals, controls the address decoder 1 and data I/O circuit 4, reads data out of a memory cell specified by an address signal, writes data to the memory cell, and refreshes the memory cell. The data I/O circuit 4 receives external data to be written into a memory cell specified by an address signal, or sends outside data read out of the memory cell.

The present invention relates to the memory cell array 3 (including sense amplifiers) of FIG. 5. The components other than the memory cell array 3 may be of any type. The present invention is applicable not only to the DRAM of FIG. 5 but also to various other types of FIG. 6 is a circuit diagram showing a DRAM according to another embodiment of the present invention.

This embodiment arranges sense amplifiers SA1 to SA3, each having a relatively large area, on each side of a memory cell array CA, to reduce an interval between adjacent bit lines. Each sense amplifier consists of two n-channel MOS transistors and two p-channel MOS transistors. The sense amplifier SA2 connected to a bit line BL2 is arranged on one side of the memory cell array CA, and the sense amplifiers SA1 and SA3 connected to bit lines BL1 and BL3, respectively, on the other side thereof. The area of each sense amplifier is larger than the area of a memory cell. Accordingly, this embodiment alternately arranges the sense amplifiers on both sides of the memory cell array CA, to reduce a gap between adjacent bit lines. This is effective to realize high integration.

Figure 6:
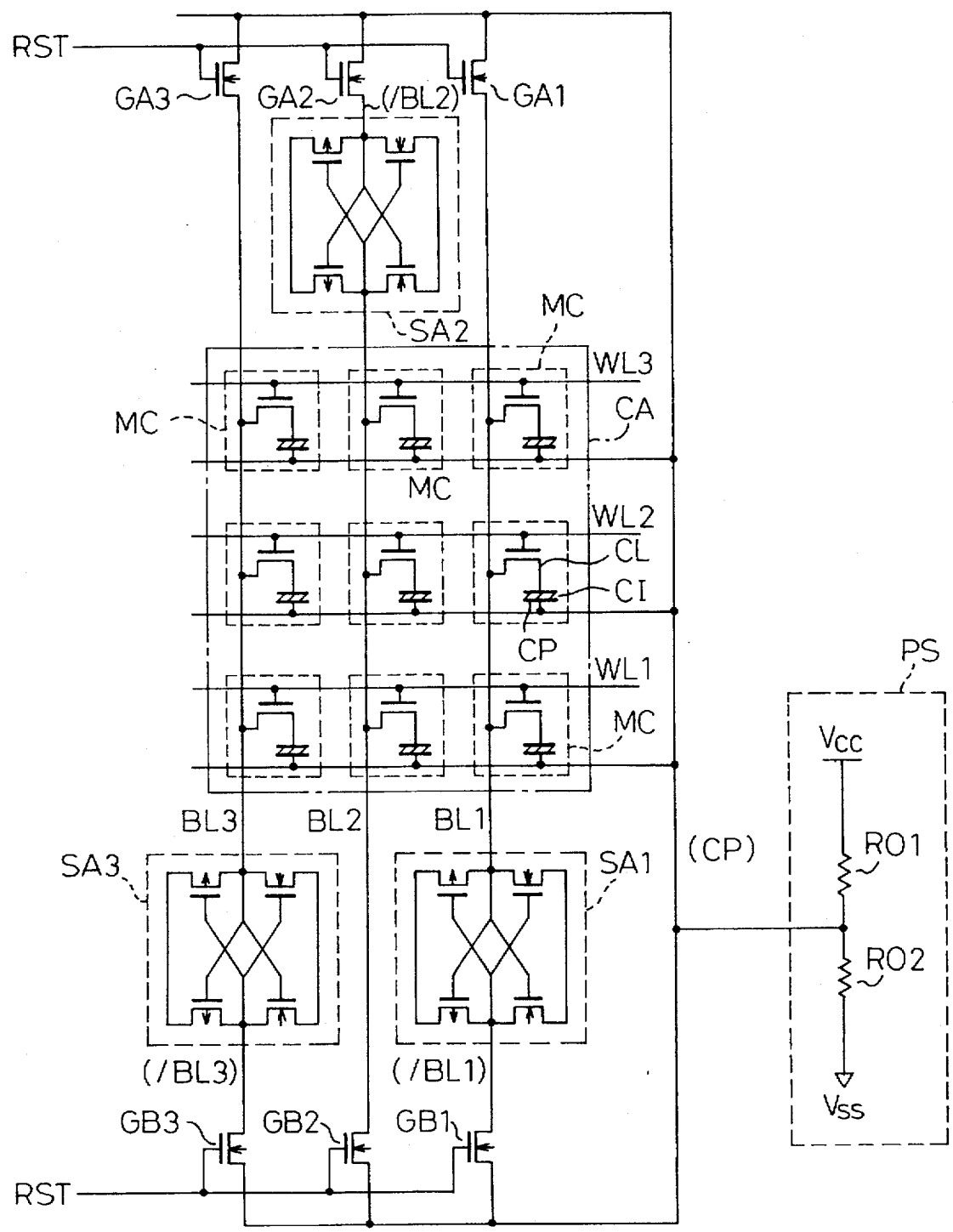
FIG. 6 is a circuit diagram showing a semiconductor memory according to another embodiment of the present invention.

A gate transistor GA2 of FIG. 6 corresponds to the first gate transistor GB2 of FIG. 3. A gate transistor GB2 of FIG. 6 corresponds to the second gate transistor GA2 of FIG. 3. The power consumption of the embodiment of FIG. 6 is low similar to the embodiment of FIG. 3.

Figure 7:
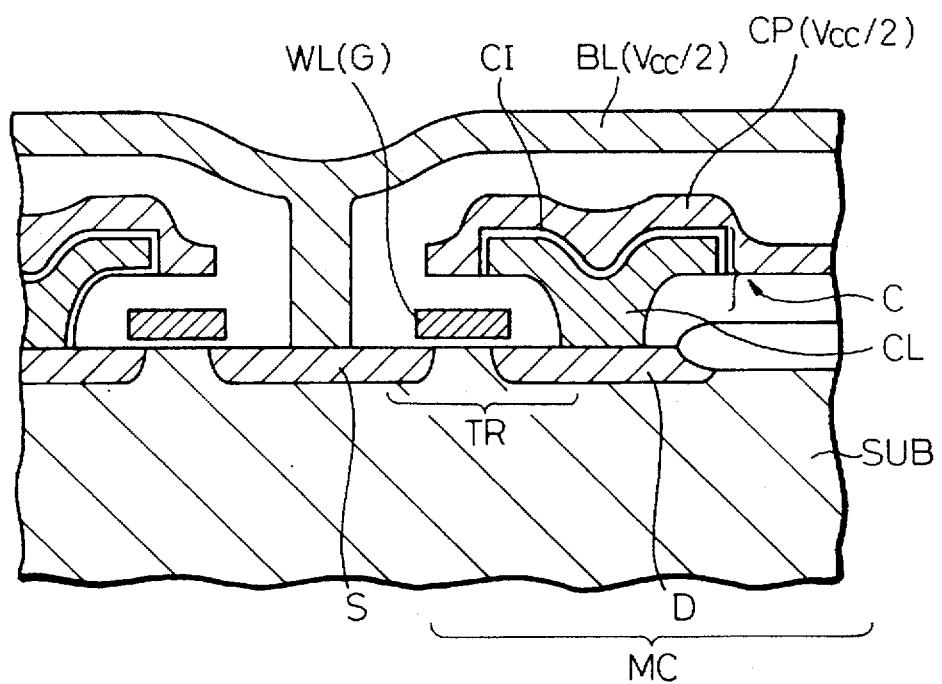
FIG. 7 is a longitudinal section showing a memory cell of a semiconductor memory according to the present invention.
Figure 8:
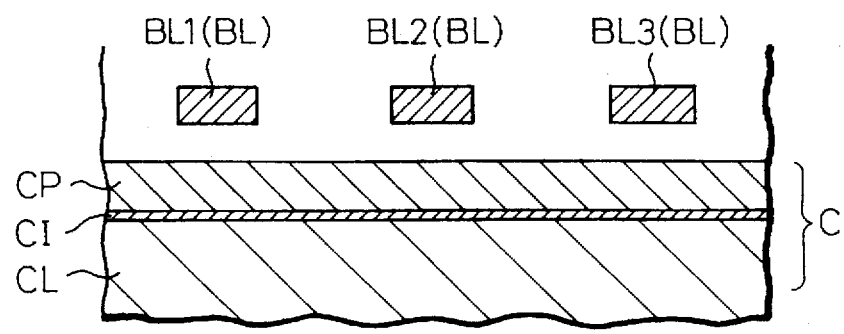
FIG. 8 is a lateral section showing the memory cell of FIG. 7.

FIG. 7 is a longitudinal section showing a memory cell of a semiconductor memory according to the present invention, and FIG. 8 is a lateral section showing the same.

In FIG. 7, the memory cell MC is composed of a transistor TR and a capacitor C. The transistor TR is formed on a semiconductor substrate SUB and has a drain D, a source S, and a gate G that is integral with a word line WL. The capacitor C has an accumulation electrode CL that is integral with the drain D of the transistor TR, a cell plate CP, and an insulation film CI made of, for example, nitride formed between the accumulation electrode CL and the cell plate CP.

As shown in FIGS. 3 and 6, the cell plates CP of memory cells are collectively connected to the output of the power source circuit PS. In FIG. 7, the cell plate CP or wiring thereof is entirely formed under bit lines BL. Since the cell plate CP is always connected to the output (for example, Vcc/2) of the power source circuit PS, the present invention demonstrates greater noise resistance than the prior arts.

The cell plate CP or wiring thereof is orthogonal to the bit lines BL and in parallel with the word lines WL as shown in FIG. 8.

Figure 9:
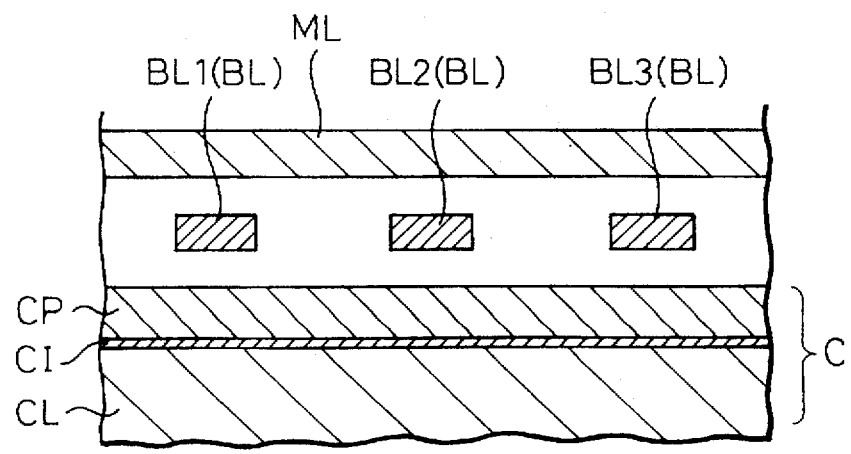
FIG. 9 is a lateral section showing a modification of a memory cell according to the present invention.

FIG. 9 is a lateral section showing a modification of a memory cell according to the present invention.

This memory cell has an insulation layer ML formed above bit lines BL1 to BL3. The potential of the insulation layer ML is, for example, Vcc/2, which is the same as the potential of a cell plate CP of a capacitor. The insulation layer ML is made of metal such as aluminum. The insulation layer ML reduces mutual interference between adjacent bit lines, thereby improving noise resistance.

Any one of the embodiments mentioned above connects a terminal of a sense amplifier SA to a bit line BL that has a given wiring length and is connected to memory cells, i.e., capacitive elements, and the other terminal of the sense amplifier SA to a line /BL that is short and connected to a gate transistor such as GB1, without capacitive elements. When the gate transistors GA1 to GA3 and GB1 to BG3 are turned on at reset timing, the terminals, which are at complementary levels, of each of the sense amplifiers SA1 to SA3 are connected to each other, and the output of the power source circuit PS is applied thereto. This, however, is sometimes insufficient to instantaneously set the potential of the bit lines to the reference voltage of Vcc/2. When any bit line is HIGH (Vcc), the circuit of FIG. 6 is incapable of instantaneously set the potential of the bit line to Vcc/2 at reset timing.

Whether or not the potential of bit lines is set to Vcc/2 at once at reset timing is dependent on the number of bit lines that are LOW and the number of bit lines that are HIGH because of the insufficient driving capacity of the resistors R01 and R02 of the power source circuit PS for producing the voltage Vcc/2.

Figure 10:
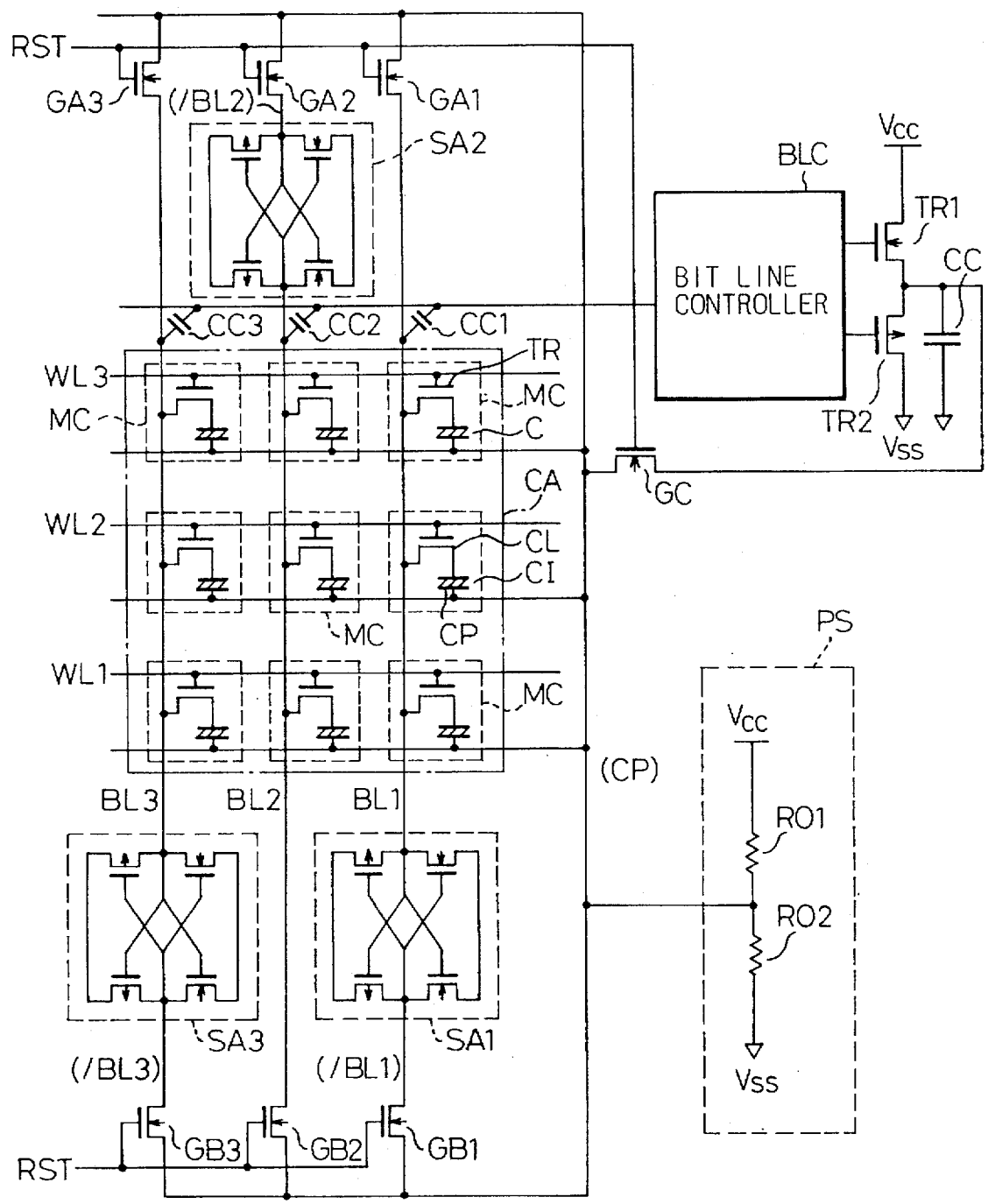
FIG. 10 is a circuit diagram showing a semiconductor memory according to still another embodiment of the present invention.

FIG. 10 is a circuit diagram showing a semiconductor memory according to still another embodiment of the present invention. This embodiment has, in addition to the structure of FIG. 6, a function of instantaneously setting the potential of bit lines BL1 to BL3 to a reference voltage of Vcc/2 at reset timing.

A bit line controller BLC detects the level of the bit lines BL1 to BL3 through an input line that is coupled with the bit lines BL1 to BL3 through capacitors CC1 to CC3. The bit line controller BLC cancels the detected level of the bit lines BL1 to BL3 by charging the bit lines, i.e., the output of a power source circuit PS through transistors TR1 and TR2, a capacitor CC, and a gate transistor GC.

When the number of bit lines that are LOW (Vss) is large, the transistor TR1 is turned on and the transistor TR2 off to accumulate a high voltage Vcc in the capacitor CC. When the gate transistor GC is turned on at reset timing, the accumulated high voltage Vcc is applied to the bit lines, to cancel an operating bit level and instantaneously set the bit lines to Vcc/2. When the number of bit lines that are HIGH (Vcc) is large, the transistor TR1 is turned off and the transistor TR2 on. At reset timing, a low voltage Vss is applied to the bit lines, to cancel an operating bit level and instantaneously set the bit lines to Vcc/2. The capacitance of the capacitor CC is set to correspond to the total capacitance of the bit lines of a memory cell array CA.

Figure 11:
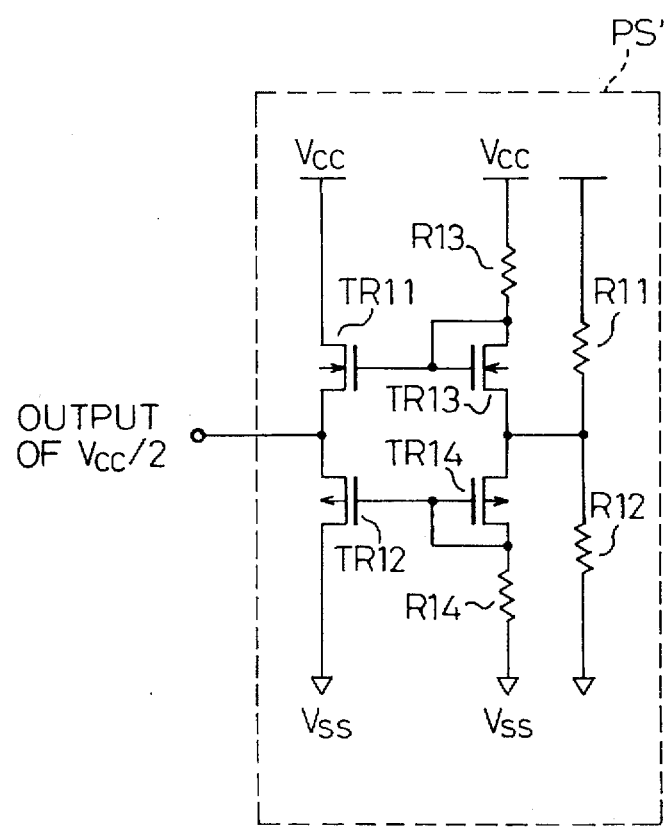
FIG. 11 is a circuit diagram showing a power source circuit of a semiconductor memory according to the present invention.

FIG. 11 is a circuit diagram showing an active power source circuit PS' of a semiconductor memory according to the present invention. This circuit PS' may be used in place of any one of the power source circuits of the embodiments of FIGS. 3 and 6. Similar to the embodiment of FIG. 10, the active power source circuit PS' is capable of instantaneously setting the level of bit lines to Vcc/2 at reset timing.

The power source circuit PS' consists of resistors R11 to R14, n-channel MOS transistors TR11 and TR13, and p-channel MOS transistors TR12 and TR14. The resistors R11 and R12 correspond to the resistors R01 and R02 of the power source circuit PS of FIG. 6.

The power source circuit PS' actively controls the switching of the transistors TR11 and TR12, to directly provide a high voltage Vcc or a low voltage Vss, to generate an output voltage (Vcc/2) determined by the resistors R11 and R12, thereby instantaneously bringing the level of bit lines to the reference voltage of Vcc/2 at reset timing.

In this way, the present invention solves the problems of the prior arts, i.e., the hindrance of high integration or the noise vulnerability by wiring the power source circuit PS to the /BL side of each sense amplifier. Any semiconductor memory of the present invention shows high noise resistance, is appropriate for high integration and large capacity, and has reduced power consumption.

As explained above in detail, a semiconductor memory according to the present invention has sense amplifiers that are each connected to a bit line and to a power source circuit that is connected to capacitors of memory cells. This structure realizes high integration, large capacity, and low power consumption.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory comprising:

a plurality of bit lines;

a plurality of memory cells, each coupled to one of said bit lines, each of said memory cells including a transistor and a capacitor, and one end of said capacitor being connected to said transistor;

a circuit coupled to other ends of said capacitors, for outputting a reference voltage; and a plurality of sense amplifiers, each having first end second input/output nodes, the first input/output nodes being coupled to a corresponding one of said bit lines and the second input/output nodes being coupled to said circuit, and said sense amplifiers amplifying a voltage between the first and second input/output nodes.

2. A semiconductor memory as claimed in claim 1, wherein said sense amplifiers are formed on both sides of said bit lines, to reduce an interval between adjacent ones of said bit lines.

3. A semiconductor memory as claimed in claim 2, wherein said sense amplifiers are arranged alternately on both sides of said bit lines.

4. A semiconductor memory as claimed in claim 1, wherein said semiconductor memory further comprises an insulation layer formed above said bit lines, a potential of said insulation layer being the same as that of cell plates of said capacitors of said memory cells.

5. A semiconductor memory as claimed in claim 1, wherein wirings for connecting cell plates of said capacitors of said memory cells are arranged in parallel with word lines.

6. A semiconductor memory as claimed in claim 1, wherein said power source unit generates an intermediate voltage between a first source voltage and a second source voltage.

7. A semiconductor memory as claimed in claim 1, wherein an output voltage of said power source unit is applied to cell plates of said capacitors of said memory cells, to said sense amplifiers through first gate transistors, and to said bit lines through second gate transistors.

8. A semiconductor memory as claimed in claim 7, wherein said first gate transistors and said second gate transistors are controlled by a reset signal.

9. A semiconductor memory as claimed in claim 1, wherein said semiconductor memory further comprises a bit line control circuit for detecting a level of said bit lines through an input line that is capacitively coupled with said bit lines, and charging said bit lines, to cancel the detected level of said bit lines.

10. A semiconductor memory as claimed in claim 1, wherein said power source unit is an active power source circuit for actively controlling an output voltage thereof to a specific voltage between a first source voltage and a second source voltage.

11. A semiconductor memory as claimed in claim 10, wherein the reference voltage is an intermediate voltage between the first source voltage and the second source voltage.

12. A semiconductor memory as claimed in claim 1, wherein said semiconductor memory is a dynamic random access memory.

* * * * *